United States Patent
Ito

(10) Patent No.: US 7,806,648 B2
(45) Date of Patent: Oct. 5, 2010

(54) TRANSPORTATION SYSTEM AND TRANSPORTATION METHOD

(75) Inventor: Yasuhisa Ito, Inuyama (JP)

(73) Assignee: Murata Kikai Kabushiki Kaisha, Kyoto-shi (JP)

( * ) Notice: Subject to any disclaimer, the term of this patent is extended or adjusted under 35 U.S.C. 154(b) by 813 days.

(21) Appl. No.: 11/783,323

(22) Filed: Apr. 9, 2007

(65) Prior Publication Data

US 2007/0284217 A1 Dec. 13, 2007

(30) Foreign Application Priority Data

Apr. 14, 2006 (JP) .............................. 2006-112401

(51) Int. Cl.
*B65G 1/00* (2006.01)
(52) U.S. Cl. ............. 414/807; 414/416.05; 414/416.11; 414/937
(58) Field of Classification Search ............ 414/222.08, 414/222.11, 222.12, 331.04, 331.1, 416.05, 414/416.11, 806, 807, 937, 940; 198/575
See application file for complete search history.

(56) References Cited

U.S. PATENT DOCUMENTS

| | | | | |
|---|---|---|---|---|
| 5,855,465 A | * | 1/1999 | Boitnott et al. | 414/331.18 |
| 5,976,199 A | * | 11/1999 | Wu et al. | 29/25.01 |
| 6,568,896 B2 | * | 5/2003 | Franklin et al. | 414/217 |
| 6,758,647 B2 | * | 7/2004 | Kaji et al. | 414/217 |
| 6,848,882 B2 | * | 2/2005 | Chen et al. | 414/626 |
| 6,979,168 B2 | | 12/2005 | Uchimaki et al. | |

FOREIGN PATENT DOCUMENTS

| | | |
|---|---|---|
| JP | 64-067932 A | 3/1989 |
| JP | 6-37227 U | 5/1994 |
| JP | 2000-091401 A | 3/2000 |
| JP | 2002-362737 A | 12/2002 |
| JP | 2003-110000 A | 4/2003 |
| JP | 2005-136294 A | 5/2005 |

OTHER PUBLICATIONS

European Search Report dated Aug. 13, 2007, issued in corresponding European patent application No. 07007643.5.

* cited by examiner

*Primary Examiner*—Douglas A Hess
(74) *Attorney, Agent, or Firm*—Westerman, Hattori, Daniels & Adrian, LLP

(57) ABSTRACT

A conveyor 4 for transporting a reticle cassette 18 is provided. A lifter 16 of a rail vehicle 14 lifts the reticle cassette 18 for transferring the reticle cassette 18 between the inside of a dummy FOUP 22 and the conveyor 4.

4 Claims, 5 Drawing Sheets

TRANSPORTATION SYSTEM AND TRANSPORTATION METHOD

TECHNICAL FIELD

The present invention relates a system for transporting small articles such as reticle cassettes using a transportation system for large articles such as semiconductor cassettes (FOUPs).

BACKGROUND ART

In semiconductor factories or the like, transportation systems for large articles such as FOUPs and transportation systems for small articles such as reticle cassettes are often provided separately. The reticle is a mask for light exposure. For example, the reticle is transported between a reticle magazine and an exposure apparatus. In occasions such as when model types are changed, and it becomes necessary to use a reticle which is not present in the reticle magazine, the reticle needs to be transported, e.g., manually. This is because, in comparison with the transportation system for FOUPs, in the transportation system for reticle cassettes, the transportation amount is small, the travel route is limited in a bay or the like, and long distance transportation is not possible.

SUMMARY OF THE INVENTION

An object of the present invention is to transport small articles between a transportation system for large articles and a transportation system for small articles.

Another object of the present invention is to make it possible to transfer a small article between a container and a conveyor through a relatively small opening without changing the orientation of the small article.

Still another object of the present invention is to reduce the wait time of a transportation system for small articles.

According to the present invention, a system for transporting a small article between a first transportation system for transportation of small articles and a second transportation system for transportation of large articles comprises a container which can store the small article, and which can be transported by the second transportation system, the container having an opening for allowing the small article to move into and out of the container; a conveyor for transporting the small article between the first transportation system and the second transportation system; a station capable of transferring the container from/to the second transportation system; and transfer means for transferring the small article between the container at the station and the conveyor. The transfer means comprises elevation means for lifting up the small article and moving means for moving the lifted up small article between the container at the station and the conveyor through the opening.

According to the present invention, a transportation method for transporting a small article between a first transportation system for transportation of small articles and a second transportation system for transportation of large articles comprises the steps of: providing a conveyor for transporting the small article between the first transportation system and the second transportation system; providing a station for supporting a container which can be transported by the second transportation system, between the second transportation system and the conveyor; and providing transfer means for transferring the small article between the container at the station and the conveyor. The container can store the small article, and has an opening for allowing the small article to move into and out of the container; the transfer means comprises elevation means and moving means; the conveyor transports the small article between the first transportation system and the transfer means; the transfer means lifts up the small article; and the lifted up small article is transferred between the container at the station and the conveyor through the opening by the moving means.

Preferably, the opening is provided on a side surface of the container and the transfer means comprises a cart guided along a rail as the moving means, and an elevation frame as the elevation means.

Further, preferably, the conveyor is used as a buffer for the small article as well.

ADVANTAGES OF THE INVENTION

In the present invention, the small article is transferred by the transfer means between the container and the conveyor through the opening of the container. In the present invention, at the time of moving the small article, the small article is lifted up. Therefore, in comparison with the case of pushing the small article using a pusher or the like, the article can be transferred smoothly. The small article can be transferred between the transfer means and the transportation system for small articles. In the present invention, the small article is placed in the container, and the container can be transported by the transportation system for large articles (second transportation system). Therefore, the transportation system for large articles can be utilized for transportation in segments where the article cannot be transported by the transportation system for small articles (first transportation system).

Preferably, the container has an opening on its side surface, and the transfer means comprises a cart guided along a rail, and an elevation frame. The small article is lifted up by the elevation frame. By movement of the cart, the small article moves between the container and the conveyor through the opening on the side surface of the container. Therefore, in comparison with the case of using a SCARA arm or the like, the small article can be transferred through the relatively small opening. Further, since the cart is used for moving the small article, in comparison with the case of using a slide fork or the like, the small article can be accurately placed in the container, or accurately placed on the conveyor.

Further, preferably, since the conveyor can be used as a buffer of the small article as well, the wait time of the transportation system for small articles is reduced. For example, if the small article is transported by the transportation system for small articles, the small article can be stored in the buffer, and if there is any delay in the transportation system for small articles, the small article can wait in the buffer.

BRIEF DESCRIPTION OF THE DRAWINGS

DESCRIPTION OF REFERENCE NUMERALS 2 transportation system
4 conveyor
6 reticle side station
7 conveyor unit
8 FOUP side unit
10 station
12 groove
14 rail vehicle
15 cart
16 lifter
17 elevation arm
18 reticle cassette
20, 24 flange
22 dummy FOUP
26 control unit
28 communication unit
30 upper level controller
32 reticle transportation vehicle controller
33 FOUP transportation vehicle controller
34 travel rail
36 reticle transportation system
38 FOUP transportation system
39 reticle magazine
40, 50 travel rail
51 support column
42, 52 overhead traveling vehicle
44, 54 travel cart
45, 55 power receiving cart
46, 56 lateral feed unit
47, 57 Θ drive
48, 58 elevation drive unit
49, 59 elevation frame
60 opening
62 hole
64 table Embodiment FIG. 1 to 7 shows a transportation system 2 according to an embodiment. In the drawings, a reference numeral 4 denotes a conveyor. The conveyor 4 includes three kinds of units, i.e., a reticle side station 6, a conveyor unit 7, and a FOUP side unit 8. These units 6 to 8 are operated independently, and each of the units 6 to 8 functions as a buffer for storing reticle cassettes (articles) 18 one by one. A station 10 is connected to the FOUP side unit 8 of the conveyor 4. A reference numeral 12 denotes a groove formed in the station 10. A rail vehicle 14 travels along the groove 12. The rail vehicle 14 includes a cart 15 and a lifter 16. The rail vehicle 14 is guided along a travel rail 34 shown in FIG. 4. The rail vehicle 14 may be equipped with a motor to travel by itself. Alternatively, the rail vehicle 14 may be towed by a chain or the like. The lifter 16 is elevated or lowered by an elevation arm 17. In the embodiment, the elevation arm 17 is provided at the center in the travel direction of the lifter 16. Alternatively, the elevation arm 17 may be provided near the conveyor 4 opposite to the station 10.

Figure 1:
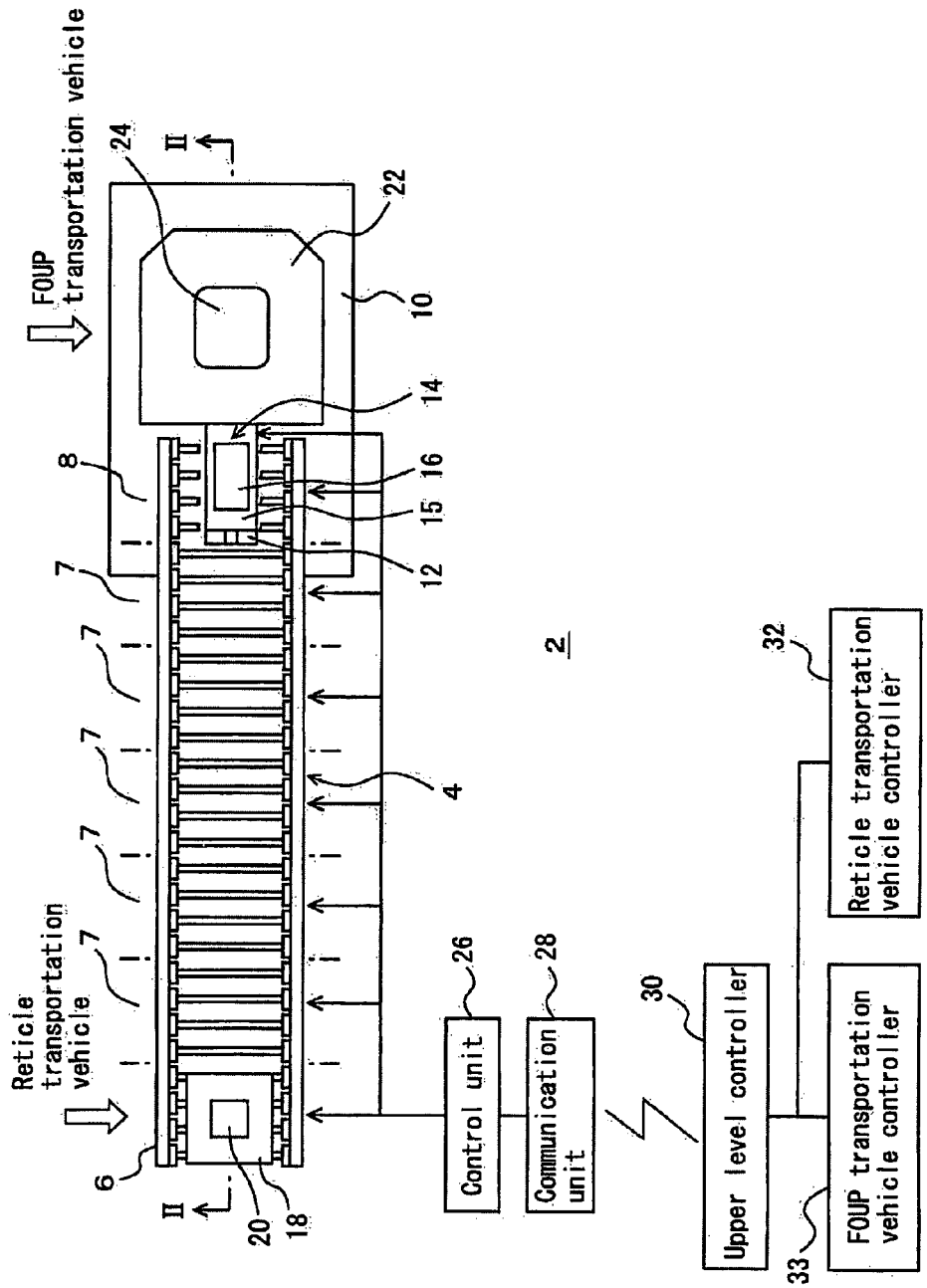
FIG. 1 is a plan view schematically showing the layout of a transportation system according to an embodiment.

The reticle cassette 18 is a cassette storing a reticle for exposure of semiconductors or liquid crystal display panels. The small article as the target of transportation is not limited to the reticle cassette, and may be a cassette as a target of spattering. A flange 20 is provided at an upper portion of the reticle cassette 18 for allowing an overhead traveling vehicle 42 shown in FIG. 4 to chuck the flange 20 for transportation of the reticle cassette 18. A reference numeral 22 denotes a dummy FOUP. The dummy FOUP 22 is placed on the station 10. An overhead traveling vehicle 52 shown in FIG. 4 chucks a flange 24 of the dummy FOUP 22 for transportation of the dummy FOUP 22. The outer shape of the dummy FOUP 22 is similar to that of a normal FOUP for transportation of semiconductor wafers. The normal FOUP for transportation of semiconductor wafers is an example of a large article as stated in the claims, and the dummy FOUP 22 is an example of a container containing a small article for transportation.

The respective conveyor units 6 to 8 and the rail vehicle 14 of the transportation system 2 are controlled by a control unit 26. The control unit 26 communicates with an upper level controller 30 through a communication unit 28. The upper level controller 30 communicates with a reticle transportation vehicle controller 32 as a controller in a first transportation system and a FOUP transportation vehicle controller 33 as a controller in a second transportation system. The control unit 26 communicates with the controllers 32, 33 through the communication unit 28 and the upper level controller 30. Additionally, communication units for communication with the overhead traveling vehicles 42, 52 shown in FIG. 4 may be provided in the reticle side station 6 and the station 10 for allowing the overhead traveling vehicles 42, 52 to directly communicate with the stations 6, 10.

Figure 2:
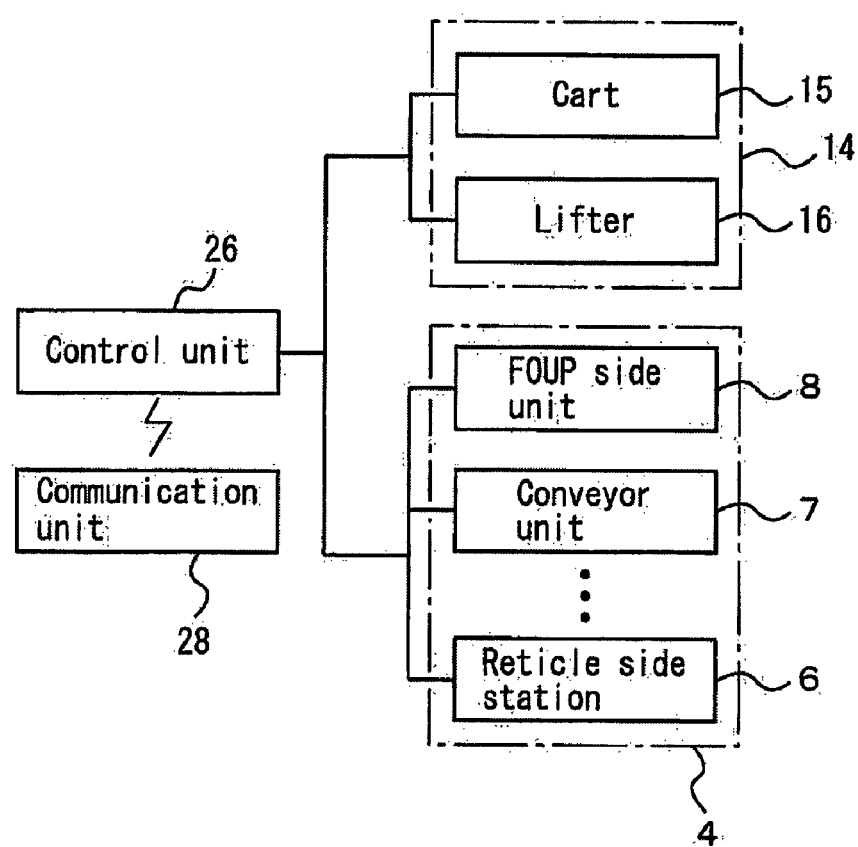
FIG. 2 is a block diagram showing the transportation system according to the embodiment from an aspect of control.

FIG. 2 shows a control system of the transportation system 2. The rail vehicle 14 includes the cart 15 and the lifter 16. The conveyor 4 includes the FOUP side unit 8 and a plurality of the conveyor units 7, and the reticle side station 6. The units 7, 8, and the station 6 are operated independently to function as an accumulation conveyor.

Figure 3:
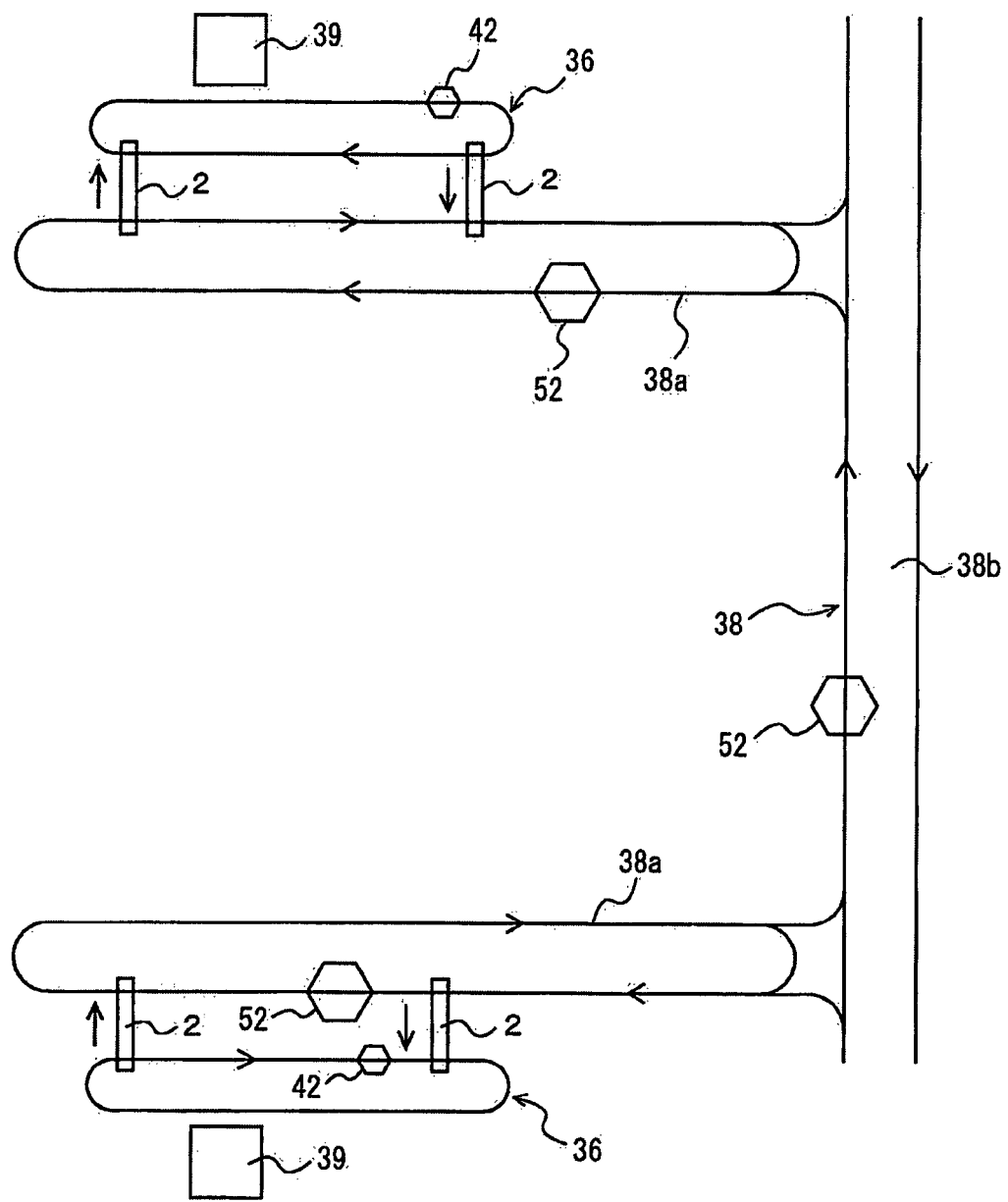
FIG. 3 is a plan view schematically showing the usage environment of the transportation system according to the embodiment.

FIG. 3 shows the usage environment of the transportation system 2 according to the embodiment. A reference numeral 38 denotes a FOUP transportation system. The FOUP transportation system 38 is an example of a second transportation system for transportation of large articles. The FOUP transportation system 38 uses the overhead traveling vehicle 52 shown in FIG. 4, and includes a plurality of intra-bay routes 38a, and an inter-bay route 38b connecting the intra-bay routes 38a. The overhead traveling vehicle 52 travels in a direction indicated by an arrow in FIG. 3. The reticle transportation system 36 is a system for transporting a reticle cassette storing a reticle between a reticle magazine 39 and an exposure apparatus (not shown) in one bay. The reticle transportation system 36 is an example of the first transportation system for transporting small articles in the claims. The reticle transportation system 36 uses the overhead traveling vehicle 42 shown in FIG. 4. The overhead traveling vehicle 42 travels around the bay in a direction indicated by an arrow in FIG. 3, and transports the reticle cassette between the different bays using the transportation system 2 and the FOUP transportation system 38. Preferably, at least a pair of the transportation systems 2 according to the embodiment are provided between the transportation systems 36, 38, and the transportation systems 2 have different directions of transporting the reticle cassettes.

Figure 4:
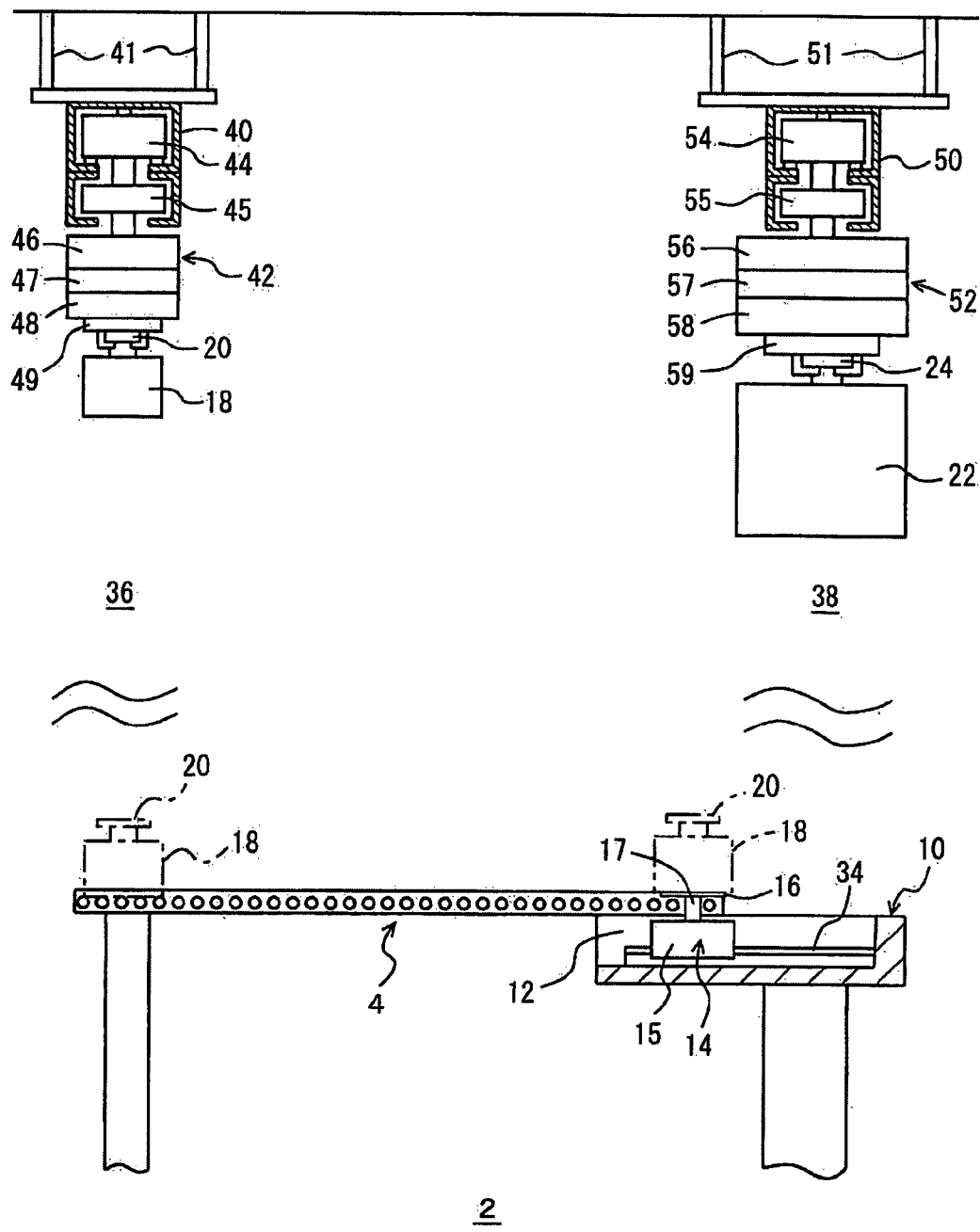
FIG. 4 is a front view with cutaway on the side of a FOUP station, showing the transportation system according to the embodiment.

Referring to FIG. 4, reference numerals 40, 50 denote travel rails. For example, the travel rails 40, 50 are supported by support columns 41, 51, e.g., in a clean room of a building. The overhead traveling vehicle 42 for reticle transportation includes a travel cart 44, a power receiving cart 45 for receiving electricity from the travel rail 40, and a lateral feed unit 46 for laterally feeding a Θ drive 47 and portion below the Θ drive 47 relative to the travel rail 40. The Θ drive 47 rotates an elevation drive unit 48 in a horizontal plane and controls the orientation of the reticle cassette 18. The elevation drive unit 48 elevates/lowers the elevation frame 49 chucking the reticle cassette 18 for transferring the reticle cassette 18 to/from the exposure apparatus, the station of the reticle magazine, or the reticle side station 6. The lateral feed unit 46 and the Θ drive 47 may not be provided.

In the case of the overhead traveling vehicle 52 for FOUP transportation, a travel cart 54 travels inside the travel rail 50. A power receiving cart 55 receives electricity, and a lateral feed unit 56 laterally feeds a Θ drive 57, and portion below the Θ drive 57 relative to the travel rail 50. The Θ drive 57 rotates an elevation drive unit 58 and portion below the elevation unit 58 in a horizontal plane. An elevation frame 59 chucks the dummy FOUP or the normal FOUP storing a dummy FOUP 22 and a semiconductor cassette at the flange 24. The elevation frame 59 is elevated/lowered by the elevation drive unit 58. In this manner, the dummy FOUP 22 is transferred to/from the station 10.

Figure 5:
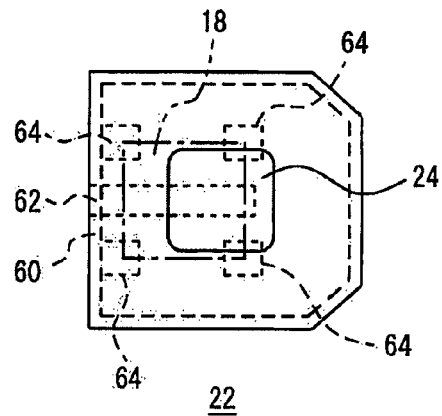
FIG. 5 is a plan view showing a dummy FOUP for reticle transportation used in the embodiment.
Figure 6:
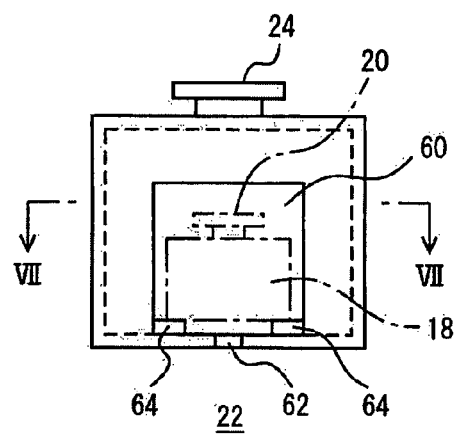
FIG. 6 is a front view showing the dummy FOUP in FIG. 5.
Figure 7:
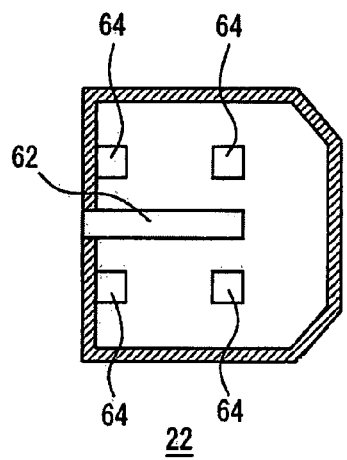
FIG. 7 is a cross sectional view taken along a line VII-VII in FIG. 6.

FIGS. 5 to 7 show a shape of the dummy FOUP 22. The shape of the dummy FOUP 22 is similar to that of the FOUP for transportation of semiconductor wafers. The dummy FOUP 22 has an opening 60 on a side surface, and has a hole 62 at the bottom. The reticle cassettes 18 are placed on tables 64, e.g. provided at four positions in the dummy FOUP 22. Gaps between the tables 64 is larger than the width of the lifter.

In the case of transferring the reticle cassette 18 by a rail vehicle between the dummy FOUP 22 and the conveyor, the elevation arm 17 is elevated to lift up the lifter 16, thereby lifting up the reticle cassette 18 on the conveyor or in the dummy FOUP 22. The elevation arm 17 passes through the hole 62, and the lifter and the reticle cassette 18 pass through the opening 60 to move the reticle cassette 18 toward the inside or outside of the dummy FOUP 22.

In the embodiment, the elevation arm 17 in FIG. 4 is positioned at the center in the traveling direction of the lifter 16. Therefore, the dummy FOUP 22 needs to have the hole 62. However, if the elevation arm 17 is provided on a side of the lifter 16 near the conveyor 4, the hole 62 is not required, or the length of the hole 62 can be reduced. In the embodiment, the rail vehicle 14 is provided below the conveyor 4. Alternatively, the travel rail 34 and the rail vehicle 14 may be provided above the conveyor 4. In this case, the flange 20 is chucked and lifted up, and the reticle cassette 18 is laterally moved toward the inside or outside of the dummy FOUP 22. Further, instead of using the rail vehicle 14, a SCARA arm or a slide fork may be used to transfer the reticle cassette 18. Also in this case, the SCARA arm or the slide fork is attached to a lifter (not shown), the flange 20 is chucked by the SCARA arm or the slide fork and the reticle cassette 18 is moved laterally. In the case using the SCARA arm, the opening 60 of the dummy FOUP 22 needs to be large so that the arm can pass through the opening 60. Further, in the case of using the slide fork, the position of transferring the reticle cassette 18 tends to be inaccurate in comparison with the case of using the rail vehicle 14 or the SCARA arm.

Operation of the embodiment will be described. In the case of transporting the reticle cassette 18 from the FOUR transportation system 38 to the reticle transportation system 36, the dummy FOUP 22 storing the reticle cassette is unloaded from the overhead traveling vehicle 52 to the station 10. Then, the rail vehicle 14 travels to the right side in FIG. 4, the elevation arm 17 passes through the hole 62 of the bottom surface of the dummy FOUP 22, the lifter 16 passes through the opening 60, and the lifter 16 moves into the dummy FOUP 22. By lifting up the lifter 16, the reticle cassette 18 is transferred from the table 64 to the lifter 16. Thereafter, the rail vehicle 14 moves backwardly, and the lifter 16 is lowered. In this manner, the reticle cassette 18 is transferred to the FOUP side unit 8 of the conveyor 4. The conveyor 4 includes a plurality of units 7. The units 7 are used as the buffers. The cassette 18 waits on the conveyor 4 until the cassette 18 is transferred to the overhead traveling vehicle 42 of the reticle transportation system 36.

In the case of transporting the reticle cassette 18 from the reticle transportation system 36 to the FOUP transportation system 38, the units 7 of the conveyor 4 is used as the buffers so that the reticle cassette 18 can wait on the conveyor 4 until an empty dummy FOUP 22 arrives at the station 10. On the FOUP side unit 8, the lifter 16 is lifted up to pick up the reticle cassette 18. The rail vehicles 14 travels to the right side in FIG. 4, and the lifter 16 is lowered to unload the reticle cassette 18 onto the table 64 of the dummy FOUP 22.

In the embodiment, the following advantages can be obtained.

(1) It is possible to transport the reticle cassette 18 using the FOUP transportation systems 38 between the reticle transportation systems 36.

(2) Using the rail vehicle 14, it is possible to simply and correctly transfer the reticle cassette 18 through the relatively small opening 60 of the dummy FOUP 22.

(3) It is possible to utilize the conveyor 4 as a buffer of the reticle cassette 18.

In the embodiment, the reticle cassette 18 is shown as an example of the small article, and the FOUP is shown as an example of the large article. However, the present invention is not limited in this respect. The types of the reticle transportation system 36 and the FOUP transportation system 38 can be selected arbitrarily. Instead of using the system of overhead traveling vehicles, a system of rail vehicles, a system of long-distance conveyors, or a system of stacker cranes may be used.

The invention claimed is:

1. A system for transporting a small article between a first transportation system for transportation of small articles and a second transportation system for transportation of large articles, comprising:
a container which can store the small article, and which can be transported by the second transportation system, the container having an opening for allowing the small article to move into and out of the container;
a conveyor for transporting the small article between the first transportation system and the second transportation system; and
a transfer means for transferring the small article between the container at the station and the conveyor, wherein
the transfer means comprises elevation means for lifting up the small article and moving means for moving the lifted up small article between the container at the station and the conveyor through the opening and
the container is transferable between the second transportation system and a station, and also between the station and the conveyor.

2. The transportation system according to claim 1, wherein the opening is provided on a side surface of the container and the transfer means comprises a cart guided along a rail as the moving means, and an elevation frame as the elevation means.

3. The transportation system according to claim 1, wherein the conveyor is used as a buffer for the small article.

4. A transportation method for transporting a small article between a first transportation system for transportation of small articles and a second transportation system for transportation of large articles, comprising the steps of:

providing a conveyor for transporting the small article between the first transportation system and the second transportation system;

providing a station for supporting a container which can be transported by the second transportation system, between the second transportation system and the conveyor; and providing transfer means for transferring the small article between the container at the station and the conveyor, wherein the container can store the small article, and has an opening for allowing the small article to move into and out of the container;

the transfer means comprises elevation means and moving means;

the conveyor transports the small article between the first transportation system and the transfer means;

the transfer means lifts up the small article; and the lifted up small article is transferred between the container at the station and the conveyor through the opening by the moving means.

* * * * *